United States Patent [19]

Watanabe et al.

[11] Patent Number: 4,811,305

[45] Date of Patent: Mar. 7, 1989

[54] SEMICONDUCTOR MEMORY HAVING HIGH-SPEED SERIAL ACCESS SCHEME

[75] Inventors: Hiroshi Watanabe; Takashi Asano; Hiroaki Ikeda; Shuichi Imazeki; Yoshitaka Shiiya; Yasushi Nishikawa, all of Tokyo, Japan

[73] Assignee: NEC Corporation, Tokyo, Japan

[21] Appl. No.: 24,212

[22] Filed: Mar. 10, 1987

[30] Foreign Application Priority Data

| Mar. 10, 1986 [JP] | Japan | 61-52885 |
| Mar. 10, 1986 [JP] | Japan | 61-52886 |
| Mar. 10, 1986 [JP] | Japan | 61-52887 |
| Mar. 20, 1986 [JP] | Japan | 61-64364 |

[51] Int. Cl.[4] .............................................. G11C 8/00
[52] U.S. Cl. ..................................... 365/239; 365/230
[58] Field of Search ............... 365/189, 230, 233, 239, 365/219, 221

[56] References Cited

U.S. PATENT DOCUMENTS

4,120,048  10/1978  Fuhrman ........................... 365/239

Primary Examiner—Joseph A. Popek
Attorney, Agent, or Firm—Sughrue, Mion, Zinn, Macpeak and Seas

[57] ABSTRACT

A serial access semiconductor memory device operable at a high speed and having a large memory capacity is disclosed. The memory device includes a plurality of memory cells divided into a plurality of addresses including an initial address and an end address, a selection circuit for sequentially selecting the memory cells from the initial address towards the end address and a reset circuit for restarting the sequential selection from the initial address, and is featured in that the memory cell or cells of the initial address are of a static type while other memory cells are of a dynamic type.

12 Claims, 5 Drawing Sheets

SEMICONDUCTOR MEMORY HAVING HIGH-SPEED SERIAL ACCESS SCHEME

BACKGROUND OF THE INVENTION

The present invention relates to a semiconductor memory, and particularly to a high-speed serial access memory.

Serial access memories have been utilized for processing digital video signals or delaying data signals. Typical serial access memories are structured such that a plurality of memory cells are arranged in a matrix form of rows and columns and memory cells are sequentially addressed for reading or writing data therefrom or thereto. After a plurality bits of data are sequentially written into the respective memory cells in a predetermined order, the above respective memory cells are sequentially addressed for reading in the above predetermined order. Thus, a predetermined delay is given for the respective data signals through the serial access memory.

In view of power consumption and density of the memory, dynamic type memory cells are employed in the serial access memory. The dynamic memory cells are advantageous to obtain a memory of a large memory capacity and operable with a low power consumption. However, its operation speed, especially a speed in reading is relatively low. Therefore, a certain delay is inevitably introduced in reading the memory cell of the initial address in serial access when the serial access is to be started.

In operations, reading is made on the memory cell or cells of the initial address towards the memory cell or cells of the end address sequentially, and after the memory cell or cells of the end address are addressed, a new cycle of serial access is again initiated from the memory cell or cells of the initial address. However, it happens frequently in image processing that the memory cell or cells of the initial address are to be read immediately after memory cell or cells of an intermediate address other than the initial and end addresses are accessed. This is done by resetting an addressing circuit such as a shift register. However, in such case, no preparation has been made for the memory or memory cells of the initial address for reading because the memory cell or memory cells of the initial address have been already addressed. Accordingly, it takes some additional time to read data from the memory cell or cells of the initial address and therefore a high-speed reading operation cannot be expected.

SUMMARY OF THE INVENTION

It is an object of the present invention to provide a semiconductor memory which is operable at a high speed even for reading memory cell or cells of the initial address.

It is another object of the present invention to provide a high-speed first-in first-out (FIFO) memory device.

The serial memory according to the present invention comprises a plurality of memory cells which are classified into a plurality of addresses including an initial address and an end address, a selecting circuit for sequentially selecting the memory cell or cells one address by one address from the initial address towards the end address, and a reset circuit for controlling the selection circuit to re-start the sequential selection from the initial address, and is featured in that the memory cell or cells of at least the initial address are of a static type and the memory cells of the remaining address are of a dynamic type. Each address may includes one or more cells.

According to the present invention, the memory cell or cells of the initial address are of the static type and therefore they operate at a high speed at anytime when they are selected without any special preparation time which is inevitably required for the dynamic memory cells.

As a result, a high speed and a large capacity of memory device can be obtained by the invention.

DETAILED DESCRIPTION OF THE INVENTION

Figure 1:
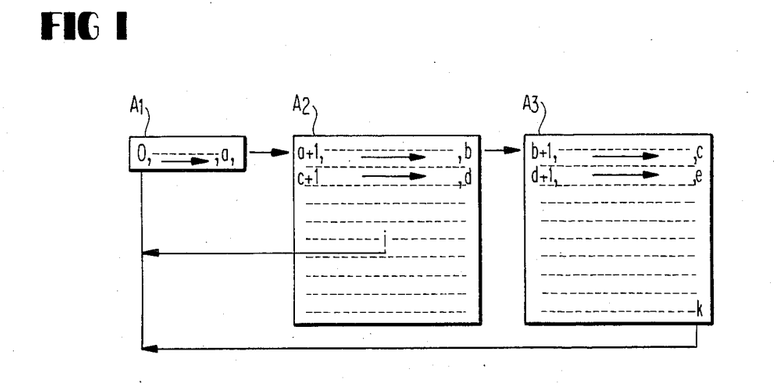
FIG. 1 is a block diagram showing a basic concept of the present invention.

Referring to FIG. 1, the basic concept of the present invention is explained.

A memory plane of a serial memory of the invention is composed of an array A1 of static memory cells, arrays A2 and A3 of dynamic memory cells. Namely, static memory cells are assigned to the initial address "0" to address "a" included in the array A1 while dynamic memory cells are assigned to the remaining address "a+1" ... "b" "b+1" ... "c" "c+1" ... "d" "d+1" ... "i" ... "k" in the arrays A2 and A3, as illustrated by arrows.

In operation, the static memory cell (cells) of the initial address "0" is accessed first and thereafter the static memory cells of the address "i" to "a" are sequentially accessed. After the access of the static cell(s) of "a", the dynamic memory cells in the array A2 are sequentially accessed from the address "a+1" to "b" and thereafter the dynamic memory cells in the array A3 are sequentially accessed from the address "b+1" to "c". Then, the cells of the array A2 are sequentially accessed from "c+1" to "d" and thereafter the cells of the array A3 are sequentially accessed from "d+1" to "e". By repeating the above access to the arrays A2 and A3 alternately, the access reaches the end address "k". After the memory cell of "k" is accessed, the address to be accessed next is returned to the initial address "0".

While the memory cells in the array A1 are sequentially accessed, the array A2 assumes a preparation state in which preparation for reading is made for respective memory cells of the array A2 and their peripheral circuits. The preparation performed for the array A2 includes precharge of digit lines and sensing of memory cell information.

Similarly, while the array A2 is accessed, the array A3 assumes a preparation state. Therefore, when the access to the memory cell(s) of the address "a" of the array A1 is finished, the memory cell(s) of "a+1" in the array A2 can be immediately accessed.

Also, after the memory cell(s) of "b" of the array A2 is accessed, the memory cell(s) of "b+1" of the array A3 can be accessed immediately.

While, the array A1 is composed of the static memory cells and therefore, no preparation is needed for accessing thereto.

Accordingly, the memory cell(s) of "0" of the array A1 can be accessed at a high-speed even when the address to be accessed is unexpectedly returned from "i" to "0".

Figure 2:
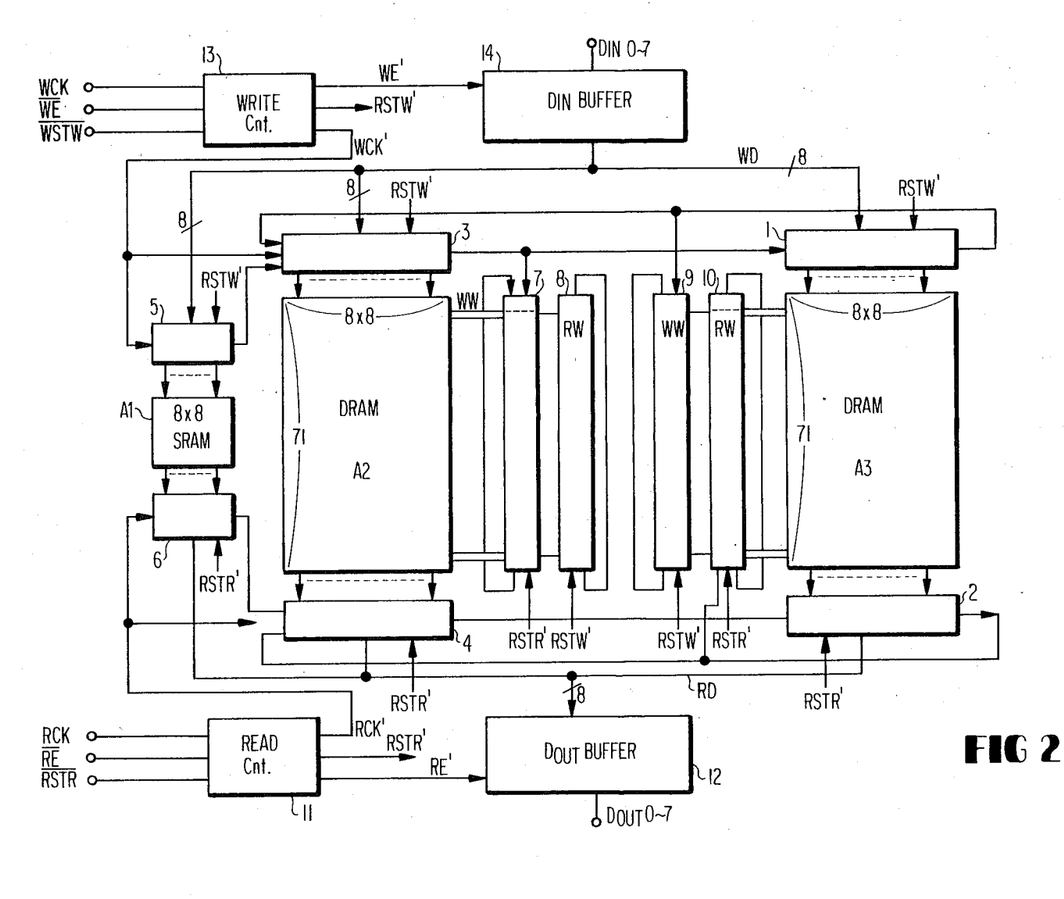
FIG. 2 is a schematic block diagram showing a serial memory according to a first embodiment of the present invention.

FIG. 2 shows a serial access memory according to the present invention.

Figure 3:
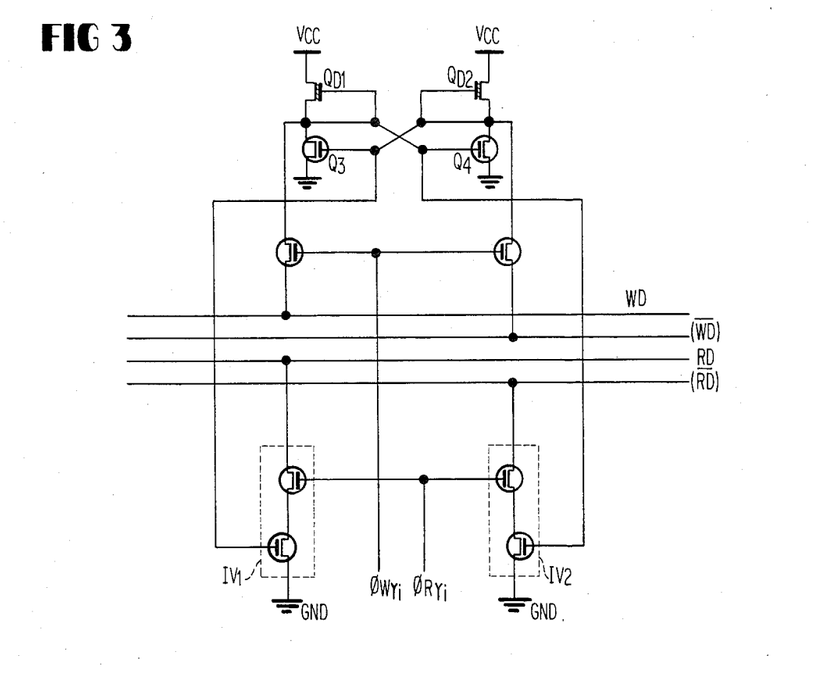
FIG. 3 is a schematic circuit diagram of a static memory cell employed in the memory of FIG. 2.

A memory place of the memory device consists of a subarray A1 of static memory cells of 8 bytes (64 bits), subarrays A2 and A3 of dynamic memory cells. Each of the subarrays A2 and A2 is composed of 568 (71×8) bytes. In each of the arrays A2 and A3, word lines are arranged in rows and bit lines are arranged in columns. The array A1 is of a 8 word×1 byte (8 bits) structure. A structure of each of the static memory cells is shown in FIG. 3. The static memory cell is composed of a pair of depletion transistors $Q_{D1}$ and $Q_{D2}$, and a pair of flip-flop transistors $Q_1$ and $Q_2$. A pair of write gate transistors $Q_3$ and $Q_4$ having gates receiving a write column selection signal $\phi_{WYi}$ generated by a write selection circuit 5 and sources or drains coupled to one bit of write data lines WD and $\overline{WD}$. A pair of gated inverters IV1 and IV2 which are enabled by a read column selection signal $\phi_{RYi}$ generated by a read selection circuit 6 are coupled between the memory cell and one bit of read data lines RD and $\overline{RD}$. The write selection circuit 5 and the read selection circuit 6 are provided for the array A1 for serially selecting 8 bytes of the memory cells in the array A1 one byte by one byte.

Figure 4:
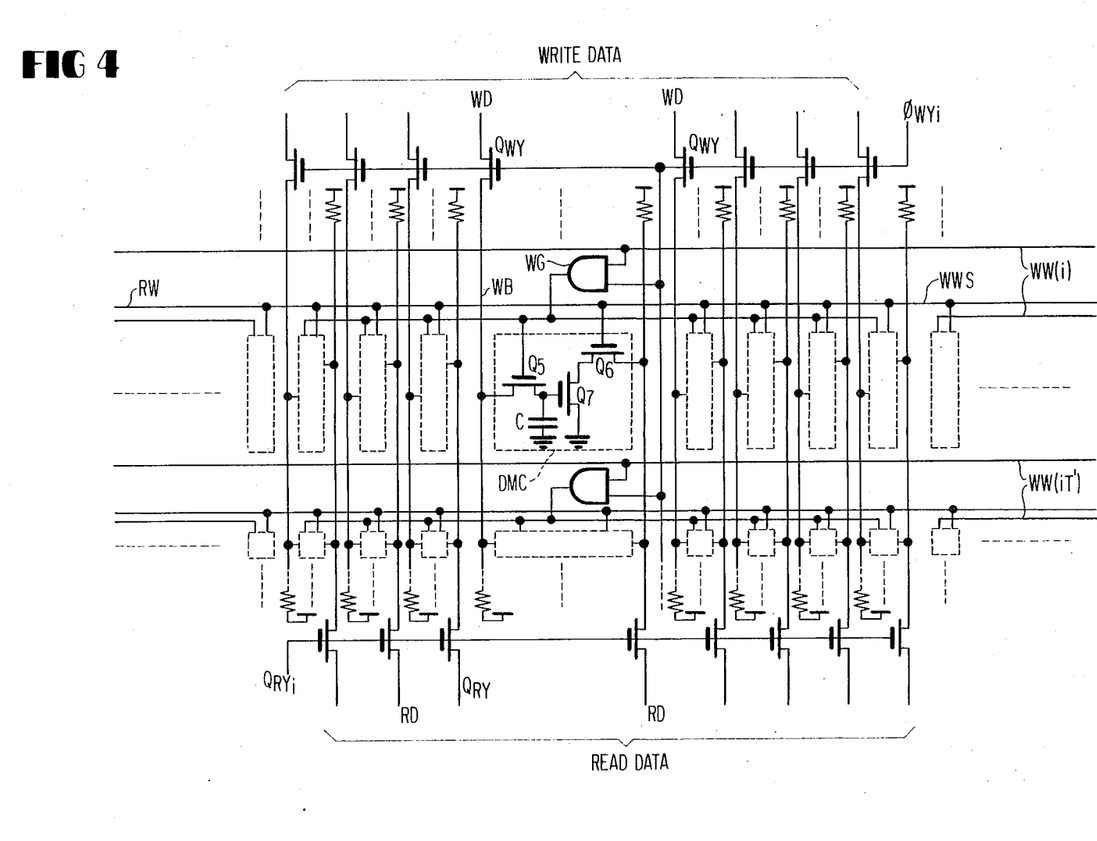
FIG. 4 is a schematic circuit diagram of a part of a dynamic memory cell array employed in the memory of FIG. 2.

A part of the arrays A2 and A3 is shown in FIG. 4. Each of the dynamic memory cells DMC is composed of a memory transistor $Q_7$ having a gate provided with a memory capacitance C, a write transistor $Q_5$ coupled between a write bit line WB and the capacitor C and having a gate coupled to a sub write word line WWS which is connected to an output of an AND gate WG having a first input coupled to a write word line WW and a second input receiving a write column selection signal $\phi_{WYi}$, and a read transistor $Q_6$ coupled between the memory transistor $Q_7$ and a read bit line RB and having a gate connected to a read word line RW. In this embodiment, 8 memory cells in the same row are selected at a time. Therefore, each adjacent 8 write bit lines WB are coupled to 8 write data lines WD through 8 write column selection transistors $Q_{WY}$ selected by the write column selection signal $\phi_{WYi}$. Similarly, each adjacent 8 read bit lines RB are coupled to 8 read data lines RD through 8 read column selection transistors $Q_{RY}$ which is enabled by a read column selection signal $\phi_{RYi}$.

A write row selection circuit 7 and a write column selection 3 are provided for the array A2 for achieving data on the write data lines WD to selected one byte (8) of memory cells. The write row selection circuit 7 serially selects 71 write word lines WW while the write column selection circuit 3 serially selects 8 bytes of bit lines. A read row selection circuit 8 and a read column selection circuit 4 are provided for the array A2 for reading data on selected 8 read digit lines to 8 read data lines RD.

Similarly, the array A3 is provided with a write row selection circuit 9 and a write column selection circuit 1 for writing, and a read row selection circuit 10 and a read column selection circuit 2 for reading.

A data input buffer 14 receives 8 bits of input data $D_{in}$ 0 to 7 and operatively produces write data on the write data lines WD. An output buffer circuit 12 is connected to the read data lines RD and outputs read signals to 8 output terminals $D_{out}$ 0~7.

A write control circuit 13 receives a write enable signal $\overline{WE}$, a write reset signal $\overline{RSTW}$ and a write address clock WCK and generates a signal WE' for enabling the buffer circuit 14 when $\overline{WE}$ is set at low and WCK is at high, a clock signal WCK' each time when WCK is set at high under the low level of $\overline{WE}$, and an address reset signal RSTW' applied to the circuits 5, 3, 7, 9 and 1 to set the address "0" of the array A1 as the initial write address.

The signal $\overline{WE}$ controls the the write operation, and when the signal $\overline{WE}$ is set to high, the write operation is disabled and when $\overline{WE}$ is at low, the write operation is conducted.

The signal $\overline{WSTW}$ is input to reset the internal write address to the initial value, that is "0". When $\overline{RSTW}$ is input, the write address is reset to the address "0". Afterwards, the write operation is performed in synchronization with WCK and the write address is incremented by one for each write cycle as, "1", "2" ... "7", "8" ... "15", "16" ... "24" ... by the selection circuits 5, 3, 1, 7 and 9. For the memory of FIG. 2, the memory size is 1144 bytes. Therefore, when the write operation is performed 1144 times from the address "0" to the address "1143" corresponding to "k" of FIG. 1, the next address is returned to "0".

The selection circuits 5, 8, 1, 7 and 9 perform jointly the serial access the arrays A1, A2 and A3, as illustrated in FIG. 1, in synchronism with WCK'.

Similarly, a read column selection circuit 4 for serially selecting each byte of the memory cells in the array A2 for reading out data thereon to the read data lines RD and a read row selection circuit 8 for selecting one of read word lines RW in the array A2 are provided for the array A2. Also a read column circuit 2 and a read row selection circuit 9 are provided for the array A3.

A read control circuit 11 receives a read enable signal $\overline{RE}$, a read address reset signal $\overline{RSTR}$ and a read shift clock signal RCK and generates an output enable signal RE' for enabling the buffer 12 when $\overline{RE}$ is at low, an address shift pulse RCK' each time when RCK becomes high under the low level of $\overline{RE}$ and an address reset signal RSTR' when $\overline{RSTR}$ is at low.

When $\overline{RE}$ is at low, read operation is conducted and one address of data (8 bits=1 byte) are read out in each cycle in synchronism with RCK'. The read address is automatically incremented by one in the memory at the end of each read cycle. The 8 bits of read data are output to $D_{out}$ 0~7 via the buffer after access time which is measured from the rising edge of the each occurrence of RCK.

The serial addressing is conducted in the same manner as shown in FIG. 1 by the selection circuits 6, 4, 8, 10 and 2. The signal $\overline{RSTR}$ is input in order to reset the internal read address to the initial value "0" of the array A1. When the signal $\overline{RSTR}$ is set at low, the read address is set to the initial address "0" independently of the write address. Afterwards, the read operation is performed with in synchronism with RCK and the read address is incremented by one for each read cycle as "1", "2" . . . .

For the respective arrays A1, A2 and A3, the read selection circuits and the write selection circuits are independently provided and both the static memory cells and the dynamic memory cell are of so-called bi-port type, read operation and write operation can be conducted asynchronously and at different speeds.

As mentioned previously, the static memory cell operates at higher speeds, however its physical size is larger. In contrast to this the dynamic memory cell is suitable for high-integration, however, it operates at lower speeds. According to the present invention, both types of these memory cells are effectively employed to utilize the advantages of each. As a result, a high-speed, high-integration serial access memory can be obtained.

With the above scheme of sequential read or write address selection, the access speed of the dynamic cell array is increased by performing row selection in the pipeline method. That is, after reset, when 8 bytes of the static memory cell array A1 is being accessed, the first row of the dynamic memory subarray A2 which is to be accessed next is to the selection level in advance. Therefore, when the selected address is moved to the first row of the dynamic memory subarray A2 after 8 bytes of the statis memory cells are accessed, a read or write cycle can be executed for the row at a high-speed within the time required for column selection. Therefore, even after the array A1 is accessed, the first row of the subarray A2 can be accessed at a high-speed.

In order to make possible the sequential selection of read address or write address and pipeline processing, shift registers are used as the column and row selection circuits in a known way.

The memory of FIG. 2 is a suitable for use as an analog signal delay line. This application is made by inputting the write reset signal $\overline{RSTW}$ and the read reset signal $\overline{RSTR}$ at different timings. The delay length is determined by the offset between the application of $\overline{RSTW}$ and the application of $\overline{RSTR}$.

FIG. 8 shows the timing chart of this operation. The data written to the address "0" by the signal $\overline{RSTW}$ is read out from the same address "0" when the signal $\overline{RSTR}$ is input thereafter. Therefore, a delay line whose delay length is determined by the offset between the input of $\overline{RSTW}$ and the input of $\overline{RSTR}$ can be configured.

Figure 5:
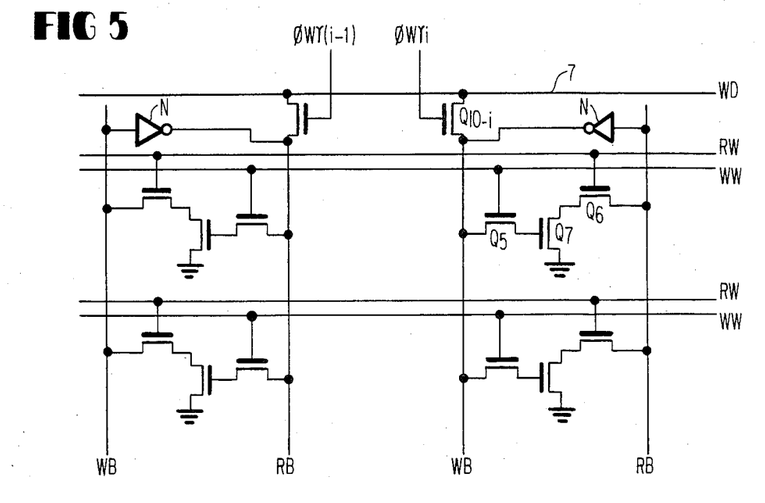
FIG. 5 is a schematic circuit diagram of a part of an array of dynamic memory cells.

FIG. 5 shows another example of the arrays A2 and A3.

In this arrangement, in place of the AND gate WG in FIG. 4, the write bit line WB is connected to the write data line WD by a transfer transistor $Q_{10-i}$ controlled by the write column selection signal $\phi_{WYi}$ for the i-th column and the gate of the write transistor $Q_5$ is connected to the write word line WW directly.

Figure 6:
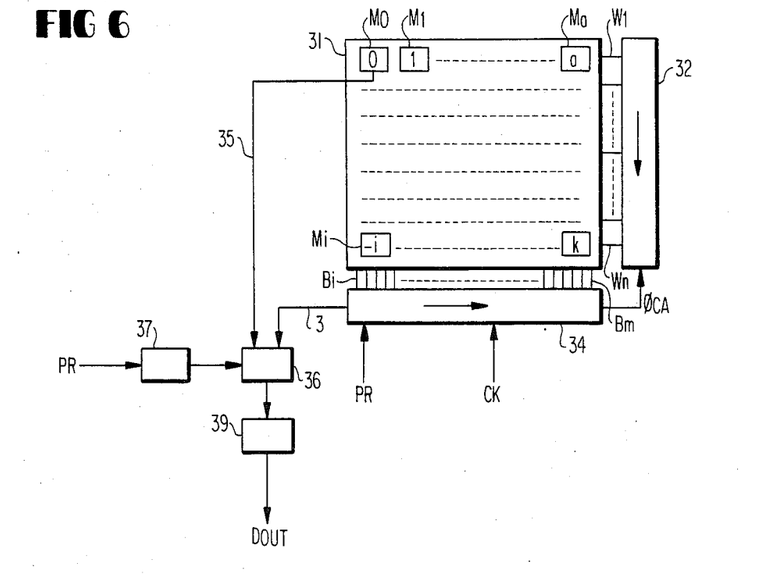
FIG. 6 is a schematic block diagram of a serial memory according to another embodiment of the invention.
Figure 7:
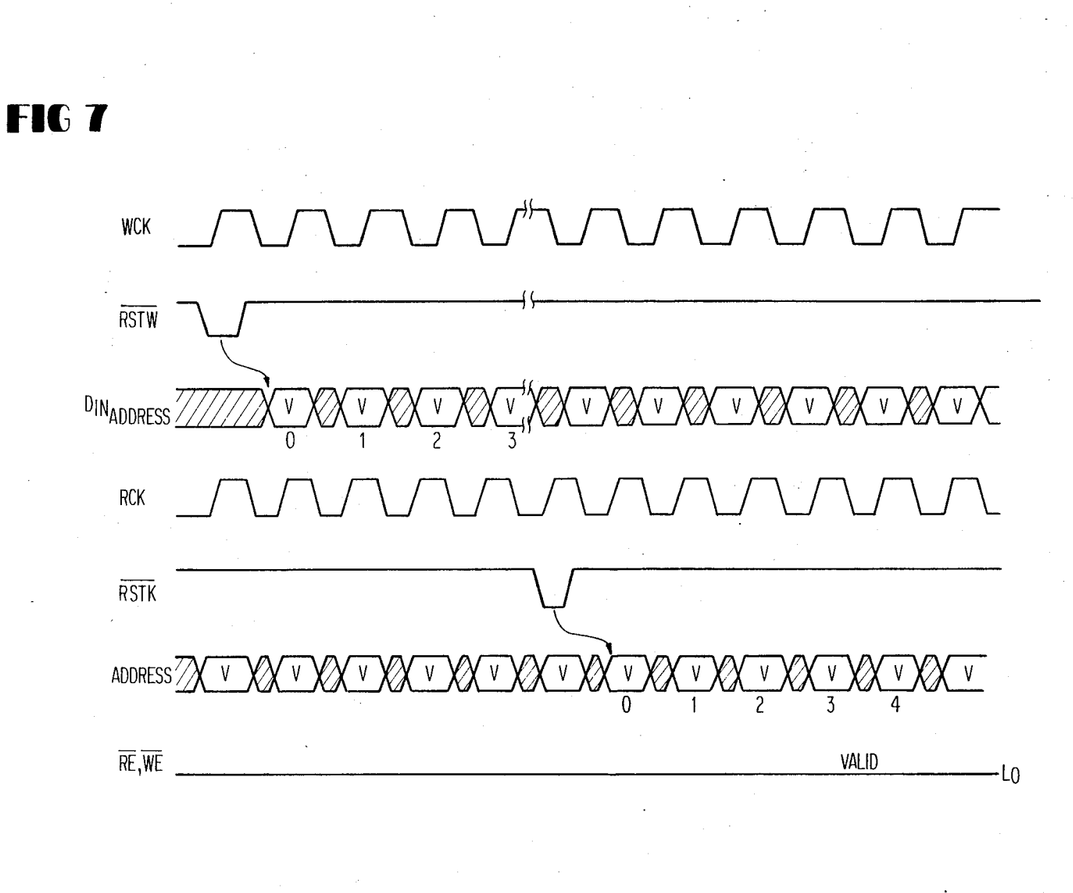
FIG. 7 is a timing chart showing operation of the memory of FIG. 2.

Referring to FIG. 6, the serial access memory according to another embodiment of the present invention is explained.

A serial memory according to this embodiment is comprised of a memory array 31 of "k+1" memory cells $M_o$ to $M_k$ given with address "0" to "k" respectively. The memory cells $M_1$ to $M_k$ are dynamic memory cells while the memory cell $M_o$ of the initial address is preferably a static memory cell but may be a dynamic cell. A row selection circuit 32 selects word lines $W_1$ to $W_n$ one by one serially while a column selection circuit 34 selects bit lines from $B_1$ to $B_m$ serially one by one.

The column selection circuit is composed of a shift register having "m+1" shift stages each corresponding to selection of $B_1$ to $B_m$ in synchronism with a shift clock CK, and the selection output of the row selection circuit 32 is incremented by one (e.g. from W1 to W2) after the bit line $B_m$ is accessed by the column selection circuit 34 in response to a carry pulse $\phi_{CA}$. A reset pulse $P_R$ is applied to the row and column selection circuits 32 and 34 so that the memory cell of the initial address "0" is addressed by the circuits 32 and 34. The both selection circuits 32 and 34 select the memory cells from the initial address "0" to the end address "k" as indicated by arrows. A bus line 33 is connected to the bit lines $B_1$ to $B_m$ via the row selection circuit 34 while a data line 35 is connected only to the memory cell $M_o$ of the initial address "0". Therefore, the effective capacitance of the data line 35 is far smaller than that of the bus line 33. An output selection circuit 36 is coupled to the data line 35 and the bus line 33 and outputs data on the data line 35 by a control circuit 47 when the address "0", i.e. the memory cell $M_o$ is selected by the reset signal $P_R$ or by the circuits 32 and 34 and otherwise outputs data on the bus line 33 to the buffer 39, to an output buffer 39.

According to this embodiment, when the memory cell $M_o$ of the initial address is selected, the data from the memory cell $M_o$ is transferred to the buffer 39 via the small capacitance of the data line 35. As a result, as soon as the memory cell $M_o$ is addressed, the data stored therein is immediately read out.

As the memory array 31, three subarrays such as A1, A2 and A3 of FIG. 2 can be effectively utilized and in such case, the data line 35 is provided only for the array A1.

We claim:

1. A semiconductor memory device comprising a plurality of memory cells being accessible by selecting memory addresses including an initial address and an end address, the memory cell or cells of at least said initial address being of a static type while the remaining memory cells being of a dynamic type, address means for sequentially selecting said memory cells one address by one address from said initial address towards said end address, and reset means responsive to a reset signal for controlling said address means to select said initial address.

2. The memory device according to claim 1, in which each of said dynamic memory cells is composed of first to third field effect transistors.

3. The memory device according to claim 1, in which said dynamic memory cells are divided into first and second sub-arrays.

4. A semiconductor memory device comprising a memory plane having a plurality of memory cells having corresponding addresses, said addresses including an initial address to an end address, address means for sequentially selecting said memory cells one address by one address from said initial address towards said end address, a first data line for receiving data from the memory cells other than said initial address, a second data line for receiving data from the memory cell or cells of said initial address, an effective capacitance of said second data line being smaller than that of said first data line reset means responsive to a reset signal for having said address means select said initial address, an output circuit, and a selection circuit coupled to said first and second data lines for applying to said output circuit data on said first data line when said initial address is selected and data on said second data line when the address other than said initial address is selected.

5. The memory device according to claim 4, in which the memory cell or cells of said initial address are of a static type while the memory cells of the address other than said initial address are of a dynamic type.

6. The memory device according to claim 4, in which said addresses are divided into rows and columns and said address means includes a column selection circuit for sequentially selecting said columns, and a row selection circuit for sequentially selecting said rows.

7. A semiconductor memory device comprising a first array of static memory cells, a second array of dynamic memory cells, a read data line, first address means for sequentially selecting said static memory cells and sequentially selecting said memory cells after said static memory cells are selected thereby to apply to said read data line data from the selected memory cell or cells in sequence, first reset means for controlling said first address means to re-start the sequentially selecting from said static memory cell or cells in response to a first reset signal, and an output circuit coupled to said read data line for generating output data in accordance with data applied to said read data line.

8. The memory device according to claim 7, further comprising a write data line, data input means for applying input data to said write data line, second address means for sequentially selecting said static memory cells and thereafter sequentially selecting said dynamic memory cells thereby to apply data on said write data line to the selected memory cell or cells, and second reset means for controlling said second address means to re-start the sequentially selecting from said static memory cell or cells.

9. A semiconductor memory device comprising a memory plane having a plurality of memory blocks arranged in a matrix form of first to N-th rows and first to M-th columns (N and M being positive integers more than 2), the memory block of the first row and the first column including at least one static type memory cell, most of the memory blocks other than said memory block of the first row and the first column including dynamic type memory cells, a column selection circuit for sequentially selecting said columns one by one from the first column to the M-th column, a row selection circuit for selecting one of said rows, said row selection circuit selected said first row at first and incrementing a position of the selected row from said first row towards said N-th row by one each time after said M-th column is selected, and a control circuit coupled to said column selection circuit and row selection circuit and being responsive to a control signal for having said column selection circuit select said first column and said first row, respectively.

10. The semiconductor memory device according to claim 9, in which said column selection circuit includes a shift register.

11. The semiconductor memory device according to claim 9, in which each of said memory blocks includes 8 memory cells.

12. The semiconductor memory device according to claim 9, in which each of said dynamic type memory cells is composed of first to third field effect transistors.

* * * * *

UNITED STATES PATENT AND TRADEMARK OFFICE
CERTIFICATE OF CORRECTION

PATENT NO. : 4,811,305

DATED : March 7, 1989

INVENTOR(S) : HIROSHI WATANABE ET AL

It is certified that error appears in the above-identified patent and that said Letters Patent is hereby corrected as shown below:

Col. 2, line 3, delete "includes" and insert --include--.

Signed and Sealed this

Twentieth Day of February, 1990

Attest:

JEFFREY M. SAMUELS

Attesting Officer

Acting Commissioner of Patents and Trademarks